United States Patent
Chan

(10) Patent No.: US 7,627,839 B1
(45) Date of Patent: Dec. 1, 2009

(54) PROCESS CORNER INDICATOR AND ESTIMATION CIRCUIT

(75) Inventor: Wai Cheong Chan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 720 days.

(21) Appl. No.: 11/272,928

(22) Filed: Nov. 14, 2005

(51) Int. Cl.
*G06F 17/50* (2006.01)
*H03K 5/01* (2006.01)
*G06F 19/00* (2006.01)

(52) U.S. Cl. .............................. 716/4; 716/6; 327/100; 700/121

(58) Field of Classification Search .................... 716/2, 716/4, 6; 327/100, 113, 175, 540, 543; 323/274; 700/121
See application file for complete search history.

(56) References Cited

U.S. PATENT DOCUMENTS

| | | | |
|---|---|---|---|
| 6,480,127 B1 | 11/2002 | Aslan | 341/119 |
| 6,710,637 B1 * | 3/2004 | Chan | 327/259 |
| 6,808,307 B1 | 10/2004 | Aslan et al. | 374/178 |
| 6,874,933 B1 * | 4/2005 | Chan | 374/171 |
| 6,914,452 B2 * | 7/2005 | Gauthier et al. | 326/98 |
| 6,930,526 B1 | 8/2005 | Silva | 327/175 |
| 6,930,542 B1 | 8/2005 | Aude | 327/543 |
| 2001/0049812 A1 * | 12/2001 | Lutkemeyer | 716/6 |
| 2004/0051562 A1 * | 3/2004 | Gauthier et al. | 326/98 |
| 2005/0057230 A1 * | 3/2005 | Saha et al. | 323/234 |
| 2006/0026544 A1 * | 2/2006 | Engel et al. | 716/6 |
| 2007/0089078 A1 * | 4/2007 | Engel et al. | 716/6 |
| 2007/0110194 A1 * | 5/2007 | de Obaldia et al. | 375/345 |
| 2008/0263490 A1 * | 10/2008 | Lewis et al. | 716/6 |

* cited by examiner

*Primary Examiner*—Stacy A Whitmore
(74) *Attorney, Agent, or Firm*—Dergosits & Noah LLP

(57) ABSTRACT

A process corner indicator circuit can be included with each die formed from a silicon wafer in order to quickly and easily give a determination of process corner. A clock generator circuit of the indicator circuit can include an array of flip-flop elements, and can be run at a lower operating voltage, such that the differences in delay in the generated timing signal are accentuated for different process corners. The period of the timing signal can be determined using slow and fast clock counters, with the slow clock counting a number of cycles of the timing signal and the fast clock counting a number of cycles of a fixed frequency. The count produced by the fast clock can correspond to the delay in the clock generator circuit, giving an indication of the process corner of the die.

17 Claims, 7 Drawing Sheets

PROCESS CORNER INDICATOR AND ESTIMATION CIRCUIT

TECHNICAL FIELD OF THE INVENTION

The present invention relates to performance analysis of individual integrated circuit die formed from a semiconductor substrate such as a silicon wafer.

BACKGROUND

The design and manufacture of very large scale integration (VLSI) integrated circuit devices continue to become more complex and sophisticated. Current VLSI technology allows for the design and manufacture of large-area integrated circuits with sub-micron feature sizes, such that millions of devices can be placed on a single chip. Even using the highest level of control in state-of-the-art technology, a fabrication process only provides control of transistor characteristics to a given range, generally a Gaussian distribution, and is not able to provide precise control to specific characteristic values. Such process gradients occur not only within a single batch of wafers, but exhibit themselves across a single wafer as well. VLSI design libraries typically are characterized using the extremes of the process distribution, referred to in the industry as the "slow" and "fast" process corners. A "typical" process corner corresponding to the center of the process distribution often also is provided.

Ideally, it would be desirable to know the process corner for each individual die. Since such knowledge to this point is impractical for large-scale device manufacture, VLSI design addresses the worst operating conditions, or slowest process corner. By choosing a design for the slow process corner, the designers can be sure that the typical and fast process corners will still work with that single design. If the designers were to choose a design that was optimal for typical or fast process corners, then those die corresponding to slow process corners might hot operate properly, resulting in lower yields and higher cost per device.

A downside to such an approach, however, is that all die then operate as if those are from the slowest process corner. If a particular die is not at the worst process corner, then the chip likely is operating at a lower frequency than is otherwise possible. Increasing the frequency would result in improving the performance of the chip. The chip also may be operating at a higher voltage than is necessary to meet timing, which results in unnecessary power usage. Unnecessary power usage is becoming evermore important as chips are increasingly used in portable devices that run from battery power.

Today, there are means to adaptively adjust the operating needs of a chip regardless of the process corner of that chip. In one such process, an advanced process power controller is used to detect a slack in critical timing. If the critical path timing has not reached a maximum, the voltage can be lowered to provide power savings. This closed loop method requires a lot of characterization collaterals to make the approach work. A simpler process that quickly and cheaply provides process corner information is desired.

DETAILED DESCRIPTION

Systems and methods in accordance with embodiments of the present invention can overcome deficiencies in existing chip designing, testing, and manufacturing processes by providing for simple determination of process corner on a die-to-die basis. By determining the process corner of each die, such as a fast, typical, or slow process corner as discussed above, the performance of each die can be improved where possible, such as by running the die at a lower voltage or at a higher frequency. The delay of a standard cell typically is determined by supply voltage, temperature, and process corner. If two of the variables (e.g., supply voltage and temperature) are fixed, the remaining variable (process corner) can dictate the delay of a circuit. A digital code can be produced that represents the process corner on which a particular die falls, without the need for tedious bench measurements or other complicated procedures. While the following examples are described for a 0.18 μm process, similar behavior can be expected for CMOS processes of different feature size.

Figure 1:
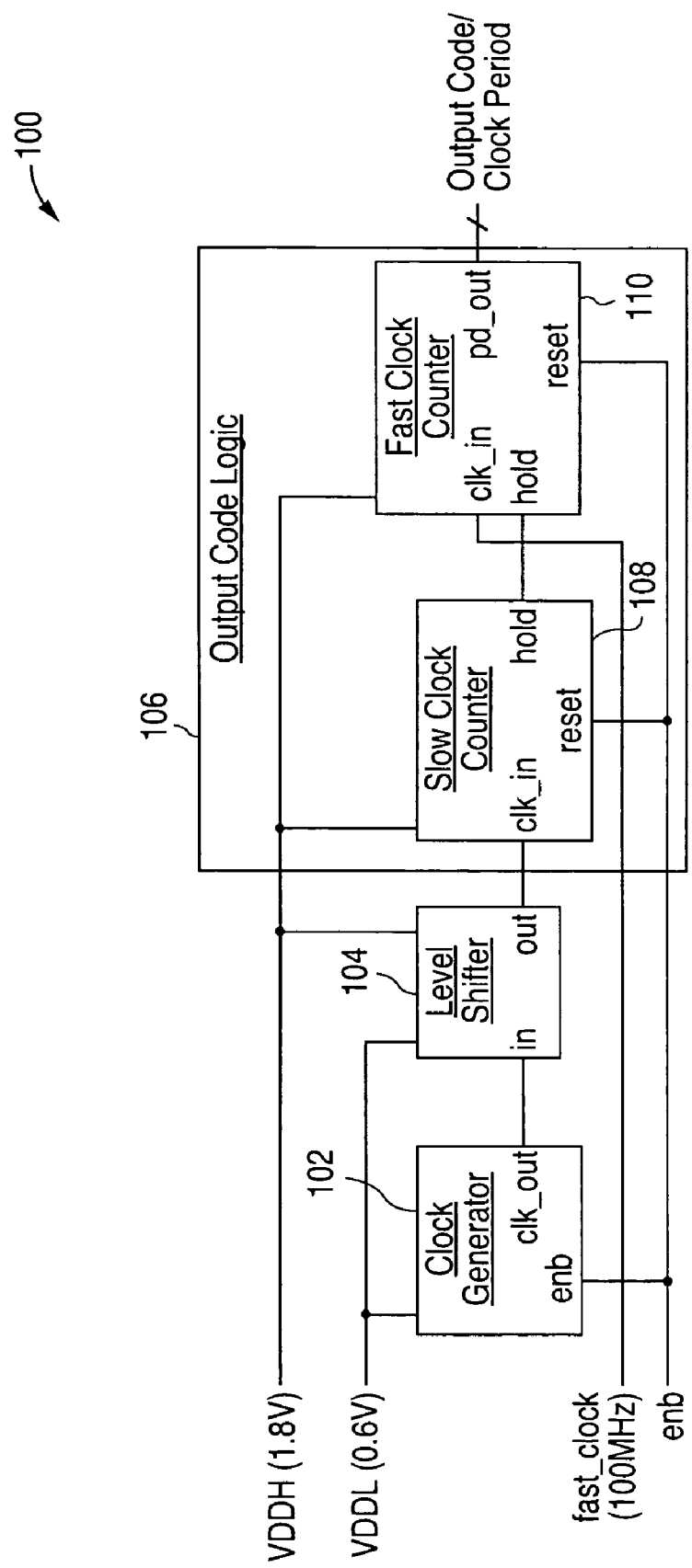
FIG. 1 is a diagram of a corner indicator circuit that can be used to determine the process corner of a die in accordance with one embodiment of the present invention.

A system in accordance with one embodiment of the present invention utilizes a process corner indicator circuit 100, such as is shown in FIG. 1. Such a circuit can be included on each individual die in order to provide an estimate of process corner information. This circuit can include a clock generator circuit 102 for generating a timing signal. This clock generator circuit 102 can be a free-running clock that can be started through application of a trigger voltage. The output frequency of a timing signal from the clock generator can be directly proportional to the supply voltage (VDDL) and temperature. By applying a lower supply voltage, such as a voltage of about 0.6V for this 1.8V process, the frequency of the timing signal will be lower, such that the delay of each standard cell becomes "worse" and the period of the output (a quasi-square wave for a digital clock generator) will be increased. As the period of the timing signal increases, the timing differences between the extreme process corners become accentuated. The period/frequency of the clock generator at a particular voltage and a particular temperature then can be a good indication of the process corner for that particular die.

Figure 2:
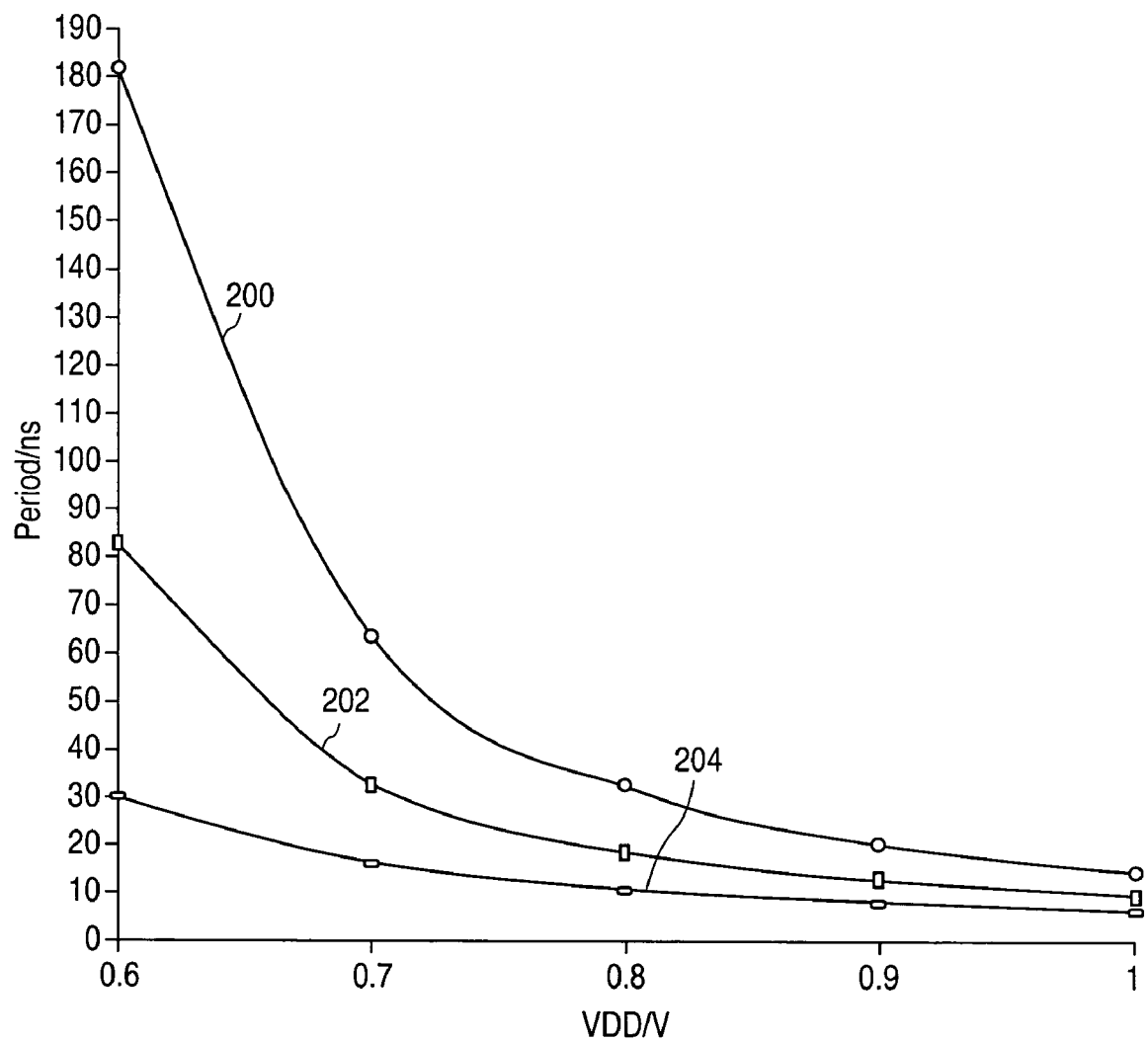
FIG. 2 is a plot showing the delay characteristics of the clock generator circuit of FIG. 3.

In one example, FIG. 2 shows period vs. voltage plots (at room temperature for a 0.18 μm process) for three different die, representing a slow process corner 200, a typical process corner 202, and a fast process corner 204. As can be seen, there is less separation between periods of the process corners at higher supply voltages (around 1.0V) than at lower supply voltages (around 0.6V). At higher voltages, such as at the 1.8V normal operating voltage, it would be difficult to make a distinction between process corners. A very high resolution process would be needed. If the clock generator can be run at 0.6V, for example, the separation between process corners is much more distinct. In this example, a slow process corner has a period of about 180 ns, while a typical process corner has a period of about 80 ns and a fast process corner has a period of about 30 ns. This large separation makes it easy to determine the process corner of a die.

The corner indicator circuit also can measure the output timing of the clock generator circuit 102. Since the clock generator is operating at a relatively low voltage, the output of the clock generator can be passed through a level shifter 104, as shown in FIG. 1. The level shifter 104 can shift the voltage level of the timing signal from the input level, 0.6V in this example, to the output level needed for the device counter, 1.8V in this example. As can be seen, the level shifter 104 takes as input both a low supply voltage (VDDL) and a high supply voltage (VDDH). The level shifted timing signal can be input into a counting device.

The level shifted timing signal can be input into any appropriate counting device capable of measuring the period/frequency of the adjusted timing signal and generating an output signal in response thereto. In the FIG. 1 embodiment, an output code logic block 106 includes a slow clock counter 108 and a fast clock counter 110. The slow counter 108 in this embodiment receives as input the high supply voltage (VDDH), the trigger/reset/enable signal (enb), and the level shifted timing signal received from the level shifter 104. This slow clock counter 108 can count a number of cycles, such as 10 cycles, of the level shifted timing signal. For a slow process corner at room temperature with a 0.6V supply voltage, the period of the timing signal should be about 180 ns as discussed above with respect to FIG. 2. After counting 10 cycles (corresponding to 1800 ns), or the selected number of cycles to be counted, the slow clock counter 108 can generate a flag, or hold signal. This hold signal can be input into the fast clock counter 110.

The fast clock counter 110 can receive as input the same trigger signal (enb) that is supplied to the clock generator 102 and the slow clock counter 108. The fast clock counter 110 also can receive a fast clock signal, in this example shown to be a 100 MHz clock signal. While the slow counter 108 counts the (level adjusted) output pulses from the clock generator 102, the fast clock counter 110 counts based on the 100 MHz fast clock signal (clk_in). In this example, each clocked cycle will take 10 ns. As discussed above, the slow clock counter 108 will output a hold signal after 10 cycles of the timing signal, or after about 1800 ns. This hold signal is input to the fast clock counter 110, which will be caused to also stop at about 1800 ns after the trigger signal. Since the fast clock counter 110 is running at 10 ns/cycle, the fast clock counter 110 will generate a count of 180 cycles. This value (180) corresponds to the period of the timing signal output from the clock generator 102 for this particular die, and is a digital count of the period without the need for a frequency counter or any other element.

The clock signal selected (here 100 MHz) can be based on a simple relationship, such that the cycle count (pd_out) output by the fast clock counter 110 corresponds to the period of the timing signal. The period of the fast clock signal can be set to an integer value, such as 10 ns, that corresponds to the number of counts, again 10, recorded by the slow clock counter 108. If the slow clock counter 108 is set to count 20 cycles of the timing signal, the period of the fast clock signal can be set to 20 ns (50 MHz). By matching the period of the fast clock signal to the number of counts of the slow clock counter 108, the output of the fast clock counter 110 can correspond to the period of the timing signal, which can provide an immediate indication of the process corner for the die by identifying that value on the plot of FIG. 2. It should be understood that the output signal can be input to any circuit or device capable of receiving this signal and generating a signal in response thereto that is an indication of the process corner of that die. This indication can be used to adjust the operating conditions of the die, such that the die can be run at a faster speed or at a lower voltage where appropriate.

Figure 3A:
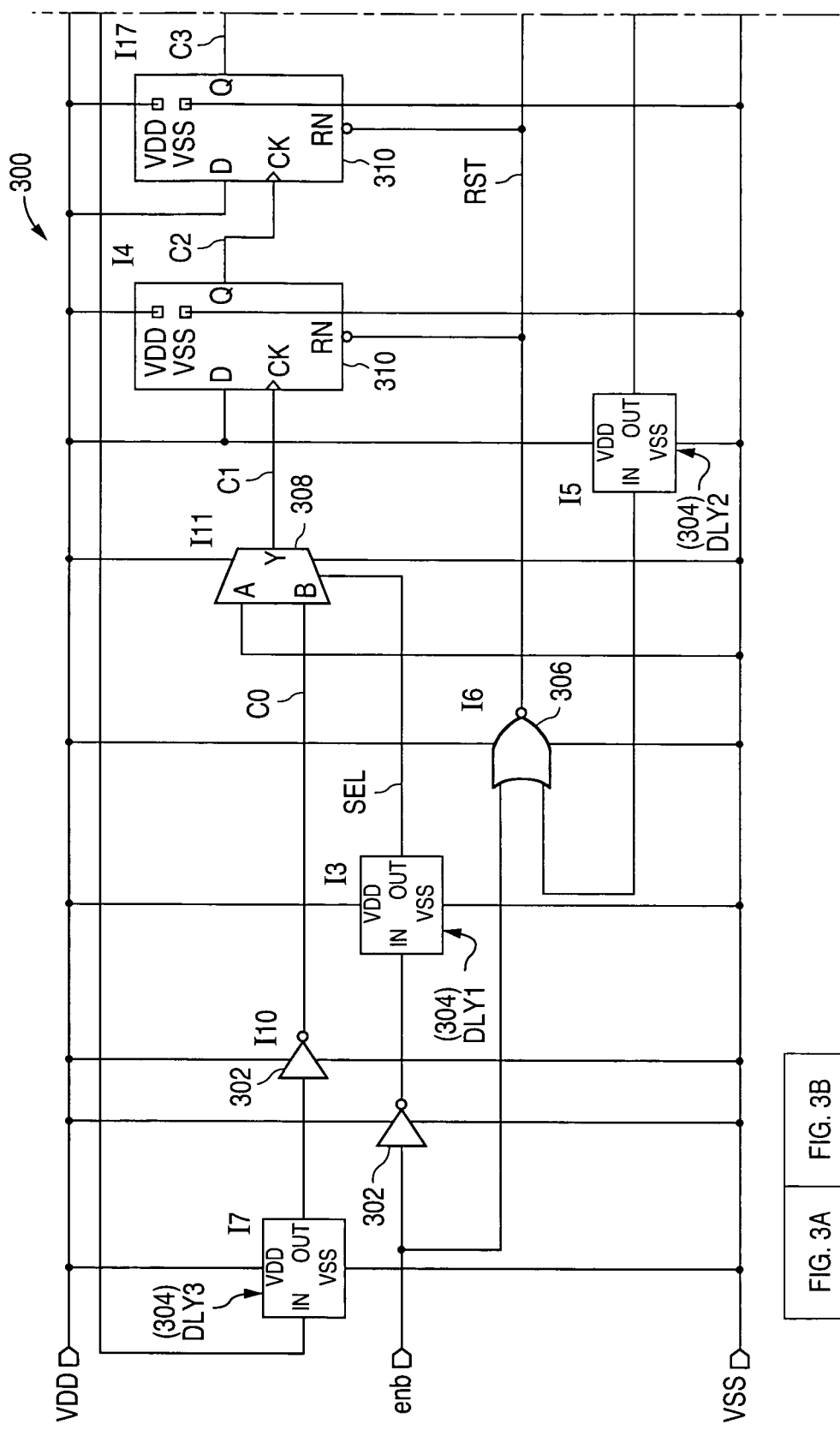
FIG. 3 is a schematic diagram of a clock generator that can be used in the circuit of FIG. 1.
Figure 3B:
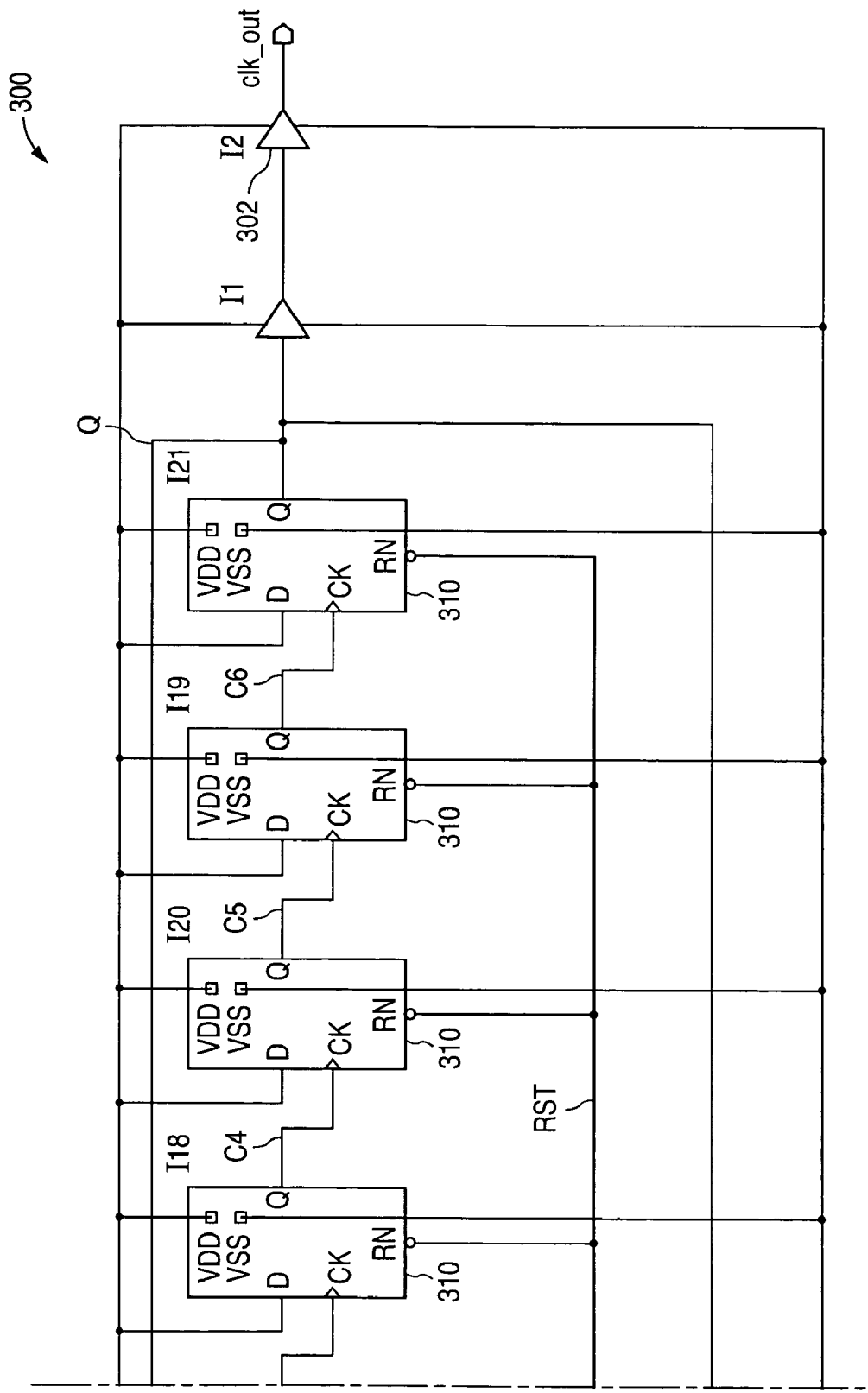

FIG. 3 shows an exemplary clock generator circuit 300 that can be used with the circuit of FIG. 1. The basic operation of such a clock generator circuit is disclosed in U.S. Pat. No. 6,874,933, which is hereby incorporated herein by reference. While such a circuit can have many components in common with the circuits described in U.S. Pat. No. 6,874,933, such as the inverters 302, delay elements 304, gates 306, and multiplexers 308 shown in FIG. 3 and discussed below with respect to FIG. 5, an advantage to a circuit such as the one shown in FIG. 3 is the inclusion of a series of flip-flop elements 310 (flip-flops). The period of the timing signal generated by such a circuit design is determined primarily by the delay of the components that make up the circuit, such that the inclusion of a series of flip-flop elements can provide a desirable amount of control over the period of the timing signal for different process corners as discussed below.

Such a clock generator circuit does not require complicated setup procedures, but instead can simply rely upon a trigger signal (enb) and a supply voltage. The clock generator circuit 300 can be used to generate a periodic pulse train, the period of the signal being dependent only on the process corner (for a particular temperature and supply voltage). When the trigger signal (enb) supplied to this circuit is high, the circuit can be in a reset state and the clock generator (and counters) will not operate. In this case, the output timing signal (clk_out) is in a low state. When the trigger signal (enb) goes low, the clock generator (and counters) can begin a free running state, whereby the periodic timing signal (clk_out) is generated.

A significant advantage of the clock generator circuit 300 in this embodiment is the increase sensitivity in delay with supply voltage. One reason for this sensitivity is the use of flip-flop elements in the clock generator circuit as discussed above. Flip-flops provide an advantage because the clock-to-Q delay of a flip-flop degrades much faster than other commonly used delay elements (such as NAND gates or buffers). Other delay elements tend not to degrade as drastically when supply voltage is decreased. While NAND gates were found to show a smaller separation, even at low voltages, flip-flops were found to show a drastic separation, such as is shown in FIG. 2. There is a limit to how low the voltage can go, however, as each circuit has a limit to what that particular technology can support.

Figure 4:
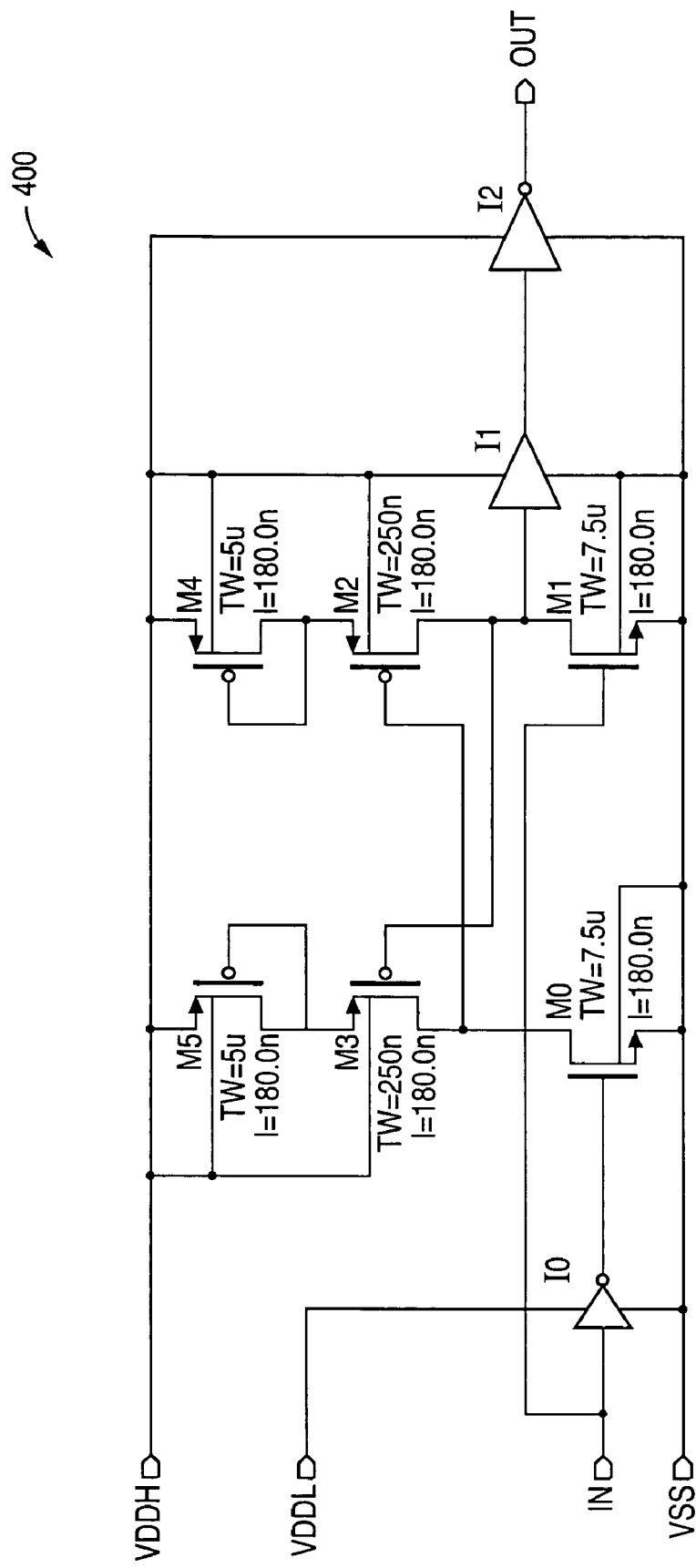
FIG. 4 is a diagram of a level shifting circuit that can be used with the circuit of FIG. 1.

FIG. 4 shows an exemplary level shifting circuit 400 that can be used with the circuit of FIG. 1. The level shifting circuit can be any appropriate level shifting circuit known in the art for shifting a signal from a relatively low voltage level to a relatively high voltage level, and as such will not be described herein in detail. As seen in the diagram, the level shifting circuit receives the timing signal (in), as well as high (VDDH) and low (VDDL) supply voltages and a reference voltage (VSS). The circuit can increase the voltage level of the timing signal without introducing any error in the timing signal.

Figure 5:
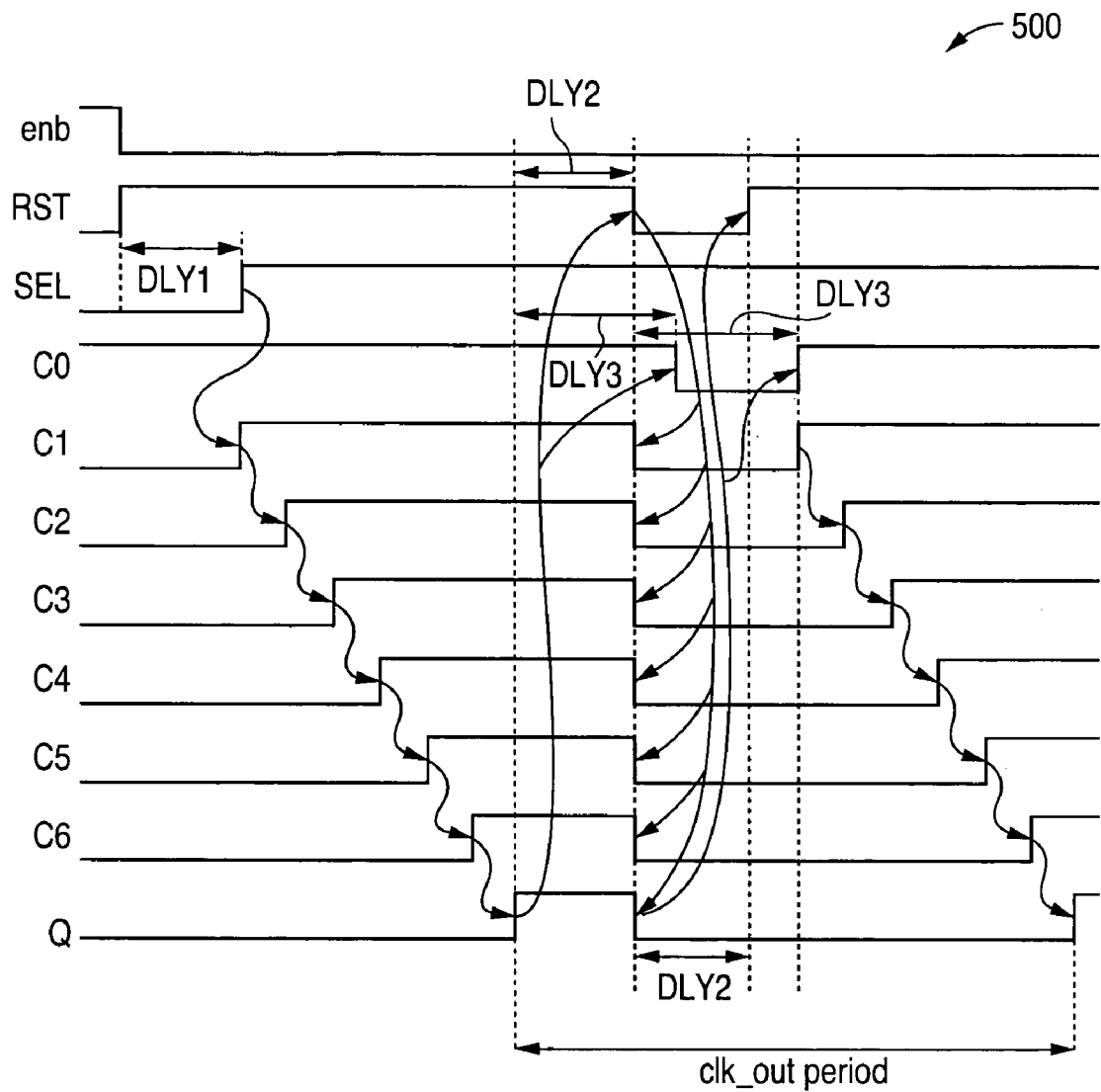
FIG. 5 is a timing diagram for the clock generator of FIG. 3.

FIG. 5 shows a timing diagram 500 for the generation of periodic pulses by a clock generator circuit such as the circuit of FIG. 3. The trigger/enable (enb) voltage can initially be set to a "high" value that is appropriate for such a circuit. This high enb value can reset the flip-flops, and the output of the multiplexer (signal C1) can be selected from input 0, which can be tied low. Since all flip-flops are in reset the output is low, which pre-conditions C0 to a high value. When signal enb switches to an appropriate "low" value, the reset voltage to the flip-flops is removed. After a delay (DLY1), signal SEL switches high. This causes C1 to go high by providing a rising edge to the first flip-flop, thereby switching the output of the first flip-flop (C2) to high. Since the input ports of all the flip-flops are tied high, the output of the second flip-flop (C3) can also switch high, after the clock-to-output delay. This process can continue until the output of the last flip-flop Q changes state to high. Signal Q going high causes RST to become active, resetting all flip-flops after some delay (DLY2). This also causes C0 to change state to low after delay DLY3.

After signal Q goes low, signal RST can go back to the inactive state after delay DLY2. Since Q changes state, C0 switches from low to high (once more) after DLY3. This transition provides a rising edge to the clock port of the first flip-flop. The process then can repeat. The end result can be the generation of a pulsed train having a period determined by the various delay elements in the circuit.

As discussed above, the timing signal can be level-shifted before being handled by subsequent logic. The subsequent logic in one embodiment includes corner code logic that provides a digital output code approximately equal to the period of the clock generator circuit (in ns). As an example, if the period of the clock generator is 100 ns then the corresponding code would be 8'h64 (or d'100).

In the corner code logic, a high value of Enb can keep the logic under reset. After triggering, the slow clock counter (a 4-bit counter would be appropriate for this example) can increment for every cycle of the level-shifted timing signal until the counter reaches 10. A hold signal then can be sent to the fast clock counter (an 8-bit counter would be appropriate for this example), which is synchronized with the slow clock counter. The 8-bit counter can increment on every fast clock count (each cycle of a 100 MHz clock signal in this example) as long as the hold signal is low. When the hold signal goes high, indicating a 10-count period from the slow clock counter, the fast clock counter can stop advancing. The value of the fast clock counter then can be the desired output as described above. Another measurement can be taken by toggling the enb signal. The above description can be represented in equation form:

total elapse time to set the hold signal=clock period (ns)×10 total elapse time when the fast counter stops=output code×10 ns therefore, output code=clock period (in ns)

In this case the output code matches the clock generator signal period in ns.

Figure 6:
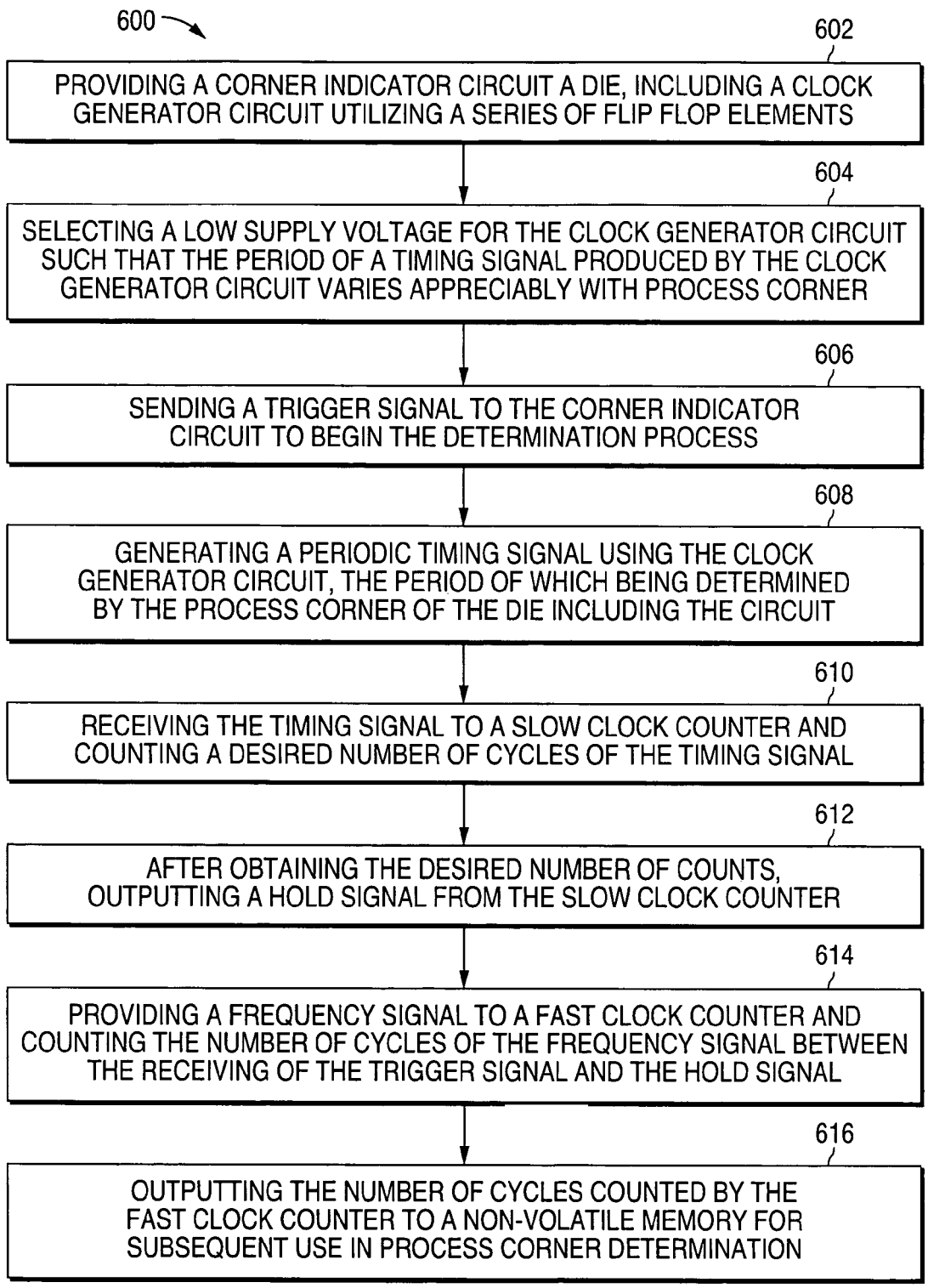
FIG. 6 is a flowchart showing steps of a process that can be used with the corner indicator circuit of FIG. 1.

FIG. 6 shows a flowchart 600 containing steps of a general method in accordance with one embodiment of the present invention that can be used with a corner indicator circuit such as is shown in FIG. 1. In this method, a corner indicator circuit is provided on a die, where the corner indicator includes a clock generator circuit utilizing a series of flip-flop elements 602. A low supply voltage is selected for the clock generator circuit such that the period of a timing signal produced by the clock generator circuit varies appreciably with process corner 604. A trigger signal is sent to the corner indicator circuit to begin the determination process 606. As discussed above, this can entail causing a high-to-low transition in an enable (enb) voltage. A clock generator circuit can begin to output a periodic timing signal with a period that is determined by the process corner of the die including that circuit 608. A slow clock counter can receive the signal and can count a desired number of cycles of the timing signal received from the clock generator circuit 610. Once the slow clock counter obtains the desired number of counts, a hold signal can be output by the slow clock counter 612. A frequency signal is provided to a fast clock counter along with the trigger signal, such that the fast counter counts a number of cycles of the frequency signal between the timing of the trigger signal and the receiving of the hold signal from the slow clock counter. The advancing of the fast clock counter is stopped upon receipt of the hold signal from the slow clock counter 614. Once the fast clock counter receives the hold signal, the fast clock counter can output the count to a non-volatile memory 616. This count then can be read at a later time to determine the process corner of the die.

Tables 1 and 2 show room temperature simulation results for a 0.18 μm technology with a nominal 1.8V supply voltage. Table 2 compares the total delay of these cells at 1.8V.

TABLE 1 simulation results

| | cell type | | | | | |
|---|---|---|---|---|---|---|
| | slow corner, 1.8 V | | fast corner, 1.8 V | | fast corner, 1.3 V | |
| cell type | Tplh/ps | Tphl/ps | Tplh/ps | Tphl/ps | Tplh/ps | Tphl/ps |
| INV | 112 | 48 | 97 | 14 | 112 | 43 |
| NAND | 129 | 67 | 107 | 31 | 129 | 64 |
| NOR | 144 | 62 | 124 | 21 | 145 | 56 |

TABLE 2

Total delay

| cell type | slow corner, 1.8 V (Tplh + Tphl)/ps | fast corner, 1.8 V (Tplh +Tphl)/ps | fast timing/ slow timing |
|---|---|---|---|
| INV | 160 | 111 | 69.4% |
| NAND | 196 | 138 | 70.4% |
| NOR | 206 | 145 | 70.4% |

From Table 2, it can be seen that the fast corner timing is only about 70% of the slow corner timing. Therefore, the silicon can be run up to about 43% faster at the same supply voltage and still meet timing. Comparing the slow corner 1.8V results to the fast corner 1.3V results in Table 1 shows that when the silicon is at the fast process corner, the supply voltage can be lowered to 1.3V and still have similar delay as silicon at the slow corner at 1.8V. Since power is proportional to the square of the voltage, there can be up to a 48% savings in power if the silicon is operated at a lower voltage (while still meeting timing requirements). This can be demonstrated using the following equation:

$$\frac{\text{power\_at\_fast\_corner}}{\text{power\_at\_slow\_corner}} = \frac{(1.3*1.3)}{(1.8*1.8)} = 52.2\%$$

Further, if the final silicon is at the fast corner, a decision could be made to obtain both higher performance and power savings. For example, a fast process corner die could be run at a higher speed that is less than the optimal speed, such as a speed less than the 43% higher available speed in this example. The die also can be run at a lower supply voltage, but at a voltage higher than the possible 1.3V voltage in this example. A balance can be made between operating performance and power savings to provide a desirable result while still meeting timing and performance requirements for the particular process.

Since the circuitry and components described herein can be contained on the die themselves, the determination of process corner can be accomplished at any appropriate time during the design, testing, and manufacture stages, such as during wafer sort. When the determination is to be made, the corner determination circuit can be triggered (at least once) using the trigger/enable (enb) signal. This process can be designed to only run once during sort for a die. The digital output can be written into non-volatile memory (or another appropriate storage device). The non-volatile memory can store the value (180, 140, etc.) until the value is subsequently read to determine, based on the characterization/simulation, the process corner for that die. The operating frequency or supply voltage for the die then can be adjusted accordingly as discussed elsewhere herein.

Such a circuit can occupy very little real estate on a die, and can use relatively very few components. Increasing the number of counts can increase the number of flip-flops needed, but this amount can be somewhat negligible (10 s of millions of transistors in a typical device vs. a few hundred transistors for the corner indicator circuit). Further, such a circuit can operate only once, after which the circuit does not use any power. A potential requirement for such an approach is that the device that contains this corner meter must have some sort of non-volatile memory to store the count. The user then can retrieve the value to determine how much to increase the frequency or reduce the operating power. For some process technologies, it might be difficult to provide this non-volatile memory module. If there is no non-volatile memory, other approaches can be used, such as a trimming method where the output count value can be trimmed into a set of pull-up/pull-down resistors. These resistors then can provide some registers with the correct inputs, equal to the output count value. The registers can be read later to retrieve the timing value. For such an approach, however, there must be some trimming capability during the testing process.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. An indicator circuit for determining an appropriate process corner from a distribution of possible process corners for a die including the indicator circuit, the die being responsive to an operating supply voltage, the indicator circuit comprising:
a clock generator circuit operable to generate a timing signal, the frequency of the timing signal depending upon the determined process corner of the die; and
a logic module operable to receive the timing signal from the clock generator circuit and output a signal in response thereto that corresponds to the determined process corner of the die, wherein
the clock generator circuit is operated at a clock generator supply voltage that is lower than the operating supply voltage of the die, thereby reducing the frequency of the timing signal, increasing the difference in the frequency and, thus, resolution across the process corners.

2. An indicator circuit according to claim 1, further comprising:
a level shifting circuit operable to level shift the timing signal from the clock generator supply voltage to the operating supply voltage.

3. An indicator circuit according to claim 1, wherein:
the clock generator circuit includes a plurality of flip-flop elements configured to increase differences in the frequency of the timing signal across the distribution of process corners.

4. An indicator circuit according to claim 1, wherein:
the logic module includes a slow clock counter operable to receive the timing signal from the clock generator circuit, the slow clock counter operable to count a predetermined number of cycles of the timing signal and output a hold signal in response thereto.

5. An indicator circuit according to claim 4, wherein:
the logic module further includes a fast clock counter operable to receive a fast frequency signal having a predetermined frequency, the fast clock counter operable to count a number of cycles of the fast frequency signal until the hold signal is received from the slow clock counter, and output a period count signal in response thereto.

6. An indicator circuit according to claim 5, further comprising:
a non-volatile memory device operable to receive the period count signal and store a period count contained therein.

7. An indicator circuit according to claim 5, further comprising:
a trigger voltage source operable to switch a trigger voltage from a first voltage level to a second voltage level in order to start the indicator circuit.

8. A method for determining the process corner of a die using a process corner indicator circuit contained on the die, the die being responsive to an operating supply voltage, the method comprising:
generating a periodic timing signal using a clock generator circuit in the process corner indicator circuit;
determining the period of the periodic timing signal;
using the period to determine the process corner of the die; and
selecting a clock generator supply voltage for the clock generator circuit that is lower than the operating supply voltage for the die, whereby the period of the timing signal is increased and the difference in frequency across the process corners is increased.

9. A method according to claim 8, further comprising:
level shifting the timing signal from the lower supply voltage to the operating supply voltage.

10. A method according to claim 8, further comprising:
providing a plurality of flip-flop elements configured to increase differences in the period of the timing signal between various process corners.

11. A method according to claim 8, further comprising:
sending a trigger signal to the process corner indicator circuit in order to activate the process corner indicator circuit.

12. A method according to claim 8, wherein:
determining the period of the periodic timing signal includes receiving the timing signal to a slow clock counter operable to count a predetermined number of cycles of the timing signal and output a hold signal in response thereto.

13. A method according to claim 12, wherein:

determining the period of the periodic timing signal further includes receiving a fast frequency signal having a predetermined frequency to a fast clock counter operable, the fast clock counter operable to count a number of cycles of the fast frequency signal until the hold signal is received from the slow clock counter, and output a period count signal in response thereto.

14. A method according to claim 13, further comprising:

receiving the period count signal to a non-volatile memory device operable to store a period count contained therein.

15. An indicator circuit for determining an appropriate process corner from a distribution of possible process corners for a die including the indicator circuit, the die being responsive to an operating supply voltage, the indicator circuit comprising:

a clock generator circuit operable to generate a timing signal, the frequency of the timing signal depending upon the process corner of the die, the clock generator circuit being operated at a clock generator supply voltage that is lower than the operating supply voltage of the die and including a plurality of flip-flop elements, thereby increasing differences in the frequency of the timing signal between process corners across the process corner distribution;

a slow clock counter operable to receive the timing signal from the clock generator circuit, the slow clock counter operable to count a predetermined number of cycles of the timing signal and output a hold signal in response thereto; and a fast clock counter operable to receive a fast frequency signal having a predetermined frequency, the fast clock counter operable to count a number of cycles of the fast frequency signal until the hold signal is received from the slow clock counter, and output a period count signal in response thereto.

16. An indicator circuit according to claim 15, further comprising:

a non-volatile memory device operable to receive the period count signal and store a period count contained therein.

17. An indicator circuit according to claim 15, further comprising:

a trigger voltage source operable to switch a trigger voltage from a first voltage level to a second voltage level in order to start the indicator circuit.

* * * * *